US010957374B2

(12) United States Patent
Matsubara

(10) Patent No.: US 10,957,374 B2
(45) Date of Patent: Mar. 23, 2021

(54) MEMORY CELLS AND ARRAYS OF MEMORY CELLS

(71) Applicant: Micron Technology, Inc., Boise, ID (US)

(72) Inventor: Yasushi Matsubara, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/878,882

(22) Filed: May 20, 2020

(65) Prior Publication Data

US 2020/0286539 A1    Sep. 10, 2020

Related U.S. Application Data

(62) Division of application No. 16/050,141, filed on Jul. 31, 2018, now Pat. No. 10,679,687.

(60) Provisional application No. 62/548,799, filed on Aug. 22, 2017.

(51) Int. Cl.
*G11C 11/22* (2006.01)
*H01L 27/11502* (2017.01)
*G11C 11/56* (2006.01)
*H01L 27/11514* (2017.01)

(52) U.S. Cl.
CPC ........ *G11C 11/221* (2013.01); *G11C 11/2257* (2013.01); *G11C 11/2259* (2013.01); *G11C 11/2273* (2013.01); *G11C 11/5657* (2013.01); *H01L 27/11502* (2013.01); *H01L 27/11514* (2013.01)

(58) Field of Classification Search
CPC ... G11C 5/025; G11C 11/221; G11C 11/5657; G11C 11/22
See application file for complete search history.

(56) References Cited

U.S. PATENT DOCUMENTS

| | | | |
|---|---|---|---|
| 5,381,364 A | 1/1995 | Chern et al. | |
| 6,292,386 B1 | 9/2001 | Honigschmid | |
| 9,837,420 B1 | 12/2017 | Ramaswamy | |
| 10,229,874 B1 | 3/2019 | Ramaswamy | |
| 2001/0038115 A1* | 11/2001 | Amanuma | H01L 21/76838 257/303 |
| 2004/0136225 A1* | 7/2004 | Ogiwara | G11C 11/22 365/145 |
| 2006/0113587 A1 | 6/2006 | Thies et al. | |
| 2017/0309322 A1 | 10/2017 | Ramaswamy et al. | |
| 2018/0059958 A1 | 3/2018 | Ryan et al. | |
| 2019/0295941 A1* | 9/2019 | Ramaswamy | G11C 5/02 |

FOREIGN PATENT DOCUMENTS

JP    2002-259729    10/2002

\* cited by examiner

*Primary Examiner* — Tuan T Nguyen
(74) *Attorney, Agent, or Firm* — Wells St. John P.S.

(57) ABSTRACT

A memory cell comprises first, second, third, and fourth transistors individually comprising a transistor gate. First and second ferroelectric capacitors individually have one capacitor electrode elevationally between the transistor gates of the first, second, third, and fourth transistors. Other memory cells are disclosed, as are arrays of memory cells.

10 Claims, 15 Drawing Sheets

MEMORY CELLS AND ARRAYS OF MEMORY CELLS

RELATED PATENT DATA

This patent resulted from a divisional application of U.S. patent application Ser. No. 16/050,141, filed Jul. 31, 2018, entitled "Memory Cells and Arrays of Memory Cells", naming Yasushi Matsubara as inventor, which claimed benefit of U.S. Provisional Patent Application Ser. No. 62/548, 799, filed Aug. 22, 2017, entitled "Memory Cells and Arrays of Memory Cells", naming Yasushi Matsubara as inventor, the disclosures of which are incorporated by reference.

TECHNICAL FIELD

Embodiments disclosed herein pertain to memory cells and to arrays of memory cells.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulating material, that stored field will be volatile or non-volatile. For example, a capacitor insulating material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and to read (i.e., determine) a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor.

A field effect transistor is another type of electronic component that may be used in a memory cell. These transistors comprise a pair of source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Field effect transistors may be ferroelectric wherein at least some portion of the gate construction (e.g., the gate insulator) comprises ferroelectric material. The two different polarized states of the ferroelectric material in transistors may be characterized by different threshold voltage ($V_t$) for the transistor or by different channel conductivity for a selected operating voltage.

An individual memory cell may contain one or more transistors and one or more capacitors.

DETAILED DESCRIPTION OF EXAMPLE EMBODIMENTS

Figure 1:
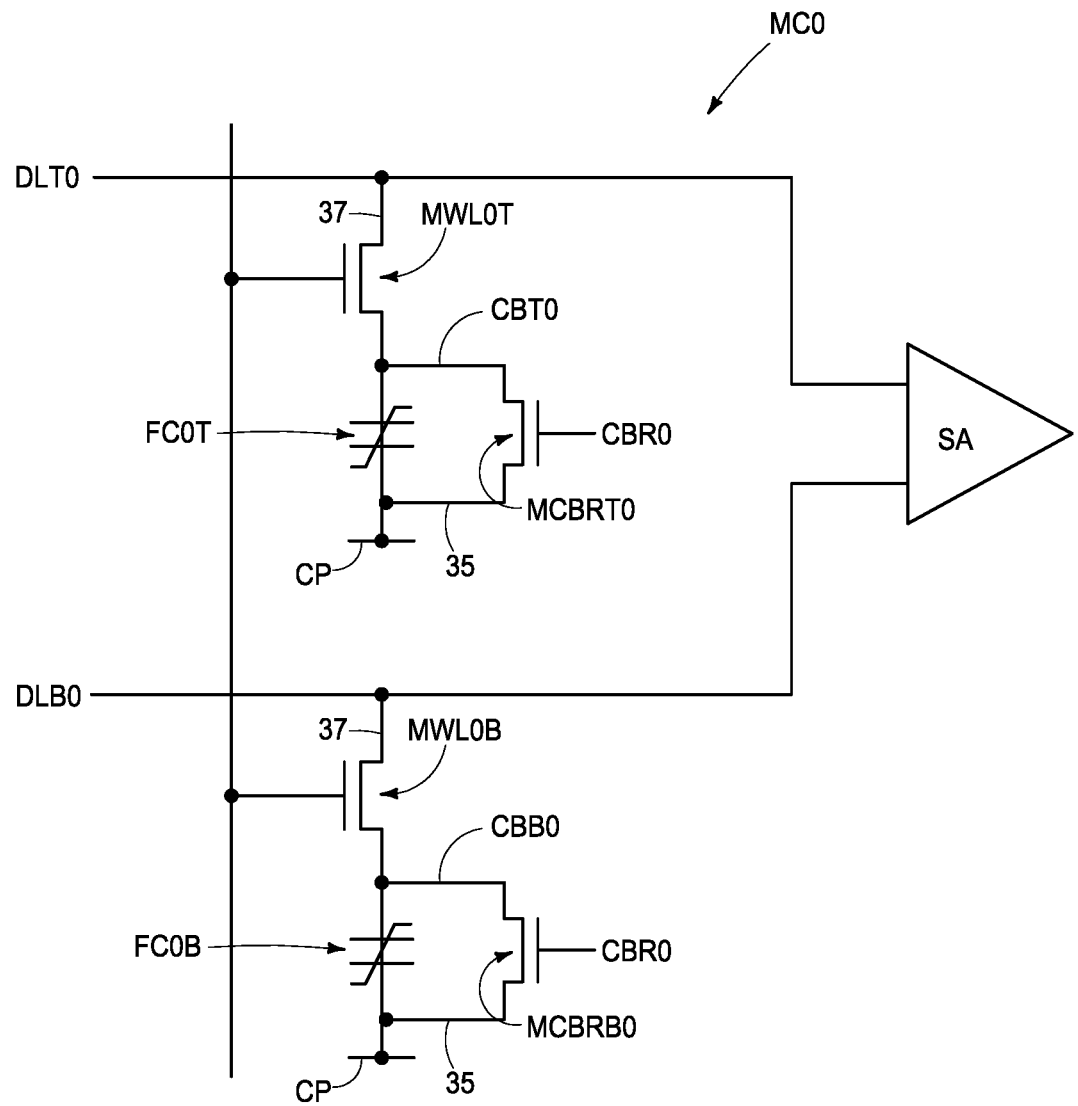
FIG. 1 is a non-structural diagrammatic schematic of a single 4T-2FC memory cell in accordance with an embodiment of the invention.
Figure 2:
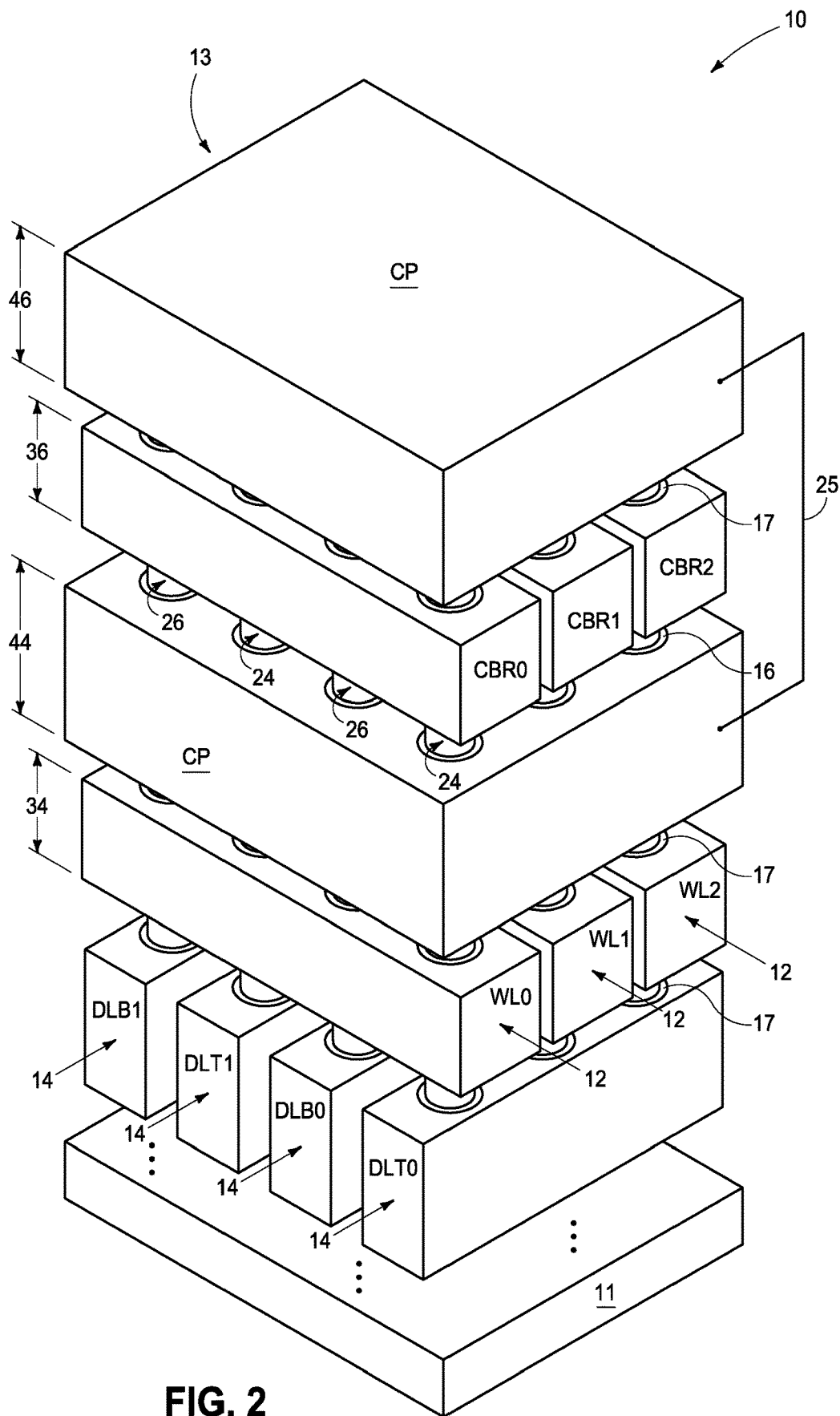
FIG. 2 is a diagrammatic hybrid schematic and structural perspective view of a portion of an array of multiple 4T-2FC memory cells of the FIG. 1 schematic in accordance with an embodiment of the invention.

Embodiments of the invention comprise single memory cells individually having four transistors and two ferroelectric capacitors (e.g., in some embodiments as the total number of transistors and capacitors in a single memory cell regardless of its schematic, and hereafter referred to as a 4T-2FC memory cell) and an array of such memory cells. First embodiments thereof are initially described with reference to FIGS. 1-6, with FIG. 1 being a schematic of one single 4T-2FC memory cell MC0 in accordance with some embodiments.

Referring to FIGS. 2-5, a substrate construction 10 comprises a base substrate 11 that may include any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 2-5-depicted materials. For example, other partially or wholly fabricated components of integrated circuitry may be provided somewhere above, about, or within base substrate 11. Control and/or other peripheral circuitry for operating components within an array of memory cells may also be fabricated, and may or may not be wholly or partially within a memory array or sub-array. Further, multiple memory sub-arrays may also be fabricated and operated independently, in tandem, or otherwise relative one another. As used in this document, a "sub-array" may also be considered as an array.

Construction 10 comprises an array 13 of 4T-2FC memory cells (e.g., MC0, MC1). Portions of only six (FIG. 5) memory cells MC0 and MC1 are collectively visible in FIGS. 2-5, with an array likely having thousands, hundreds of thousands, millions, etc. of memory cells MC* of like-construction (the symbol "*" being used herein as a generic substitute for any specific numbered component). Array 13 comprises rows 12 and columns 14 comprising a plurality of ferroelectric capacitors (e.g., FC0T, FC0B, FC1T, FC1B). Pairs of two immediately-intra-row-adjacent of the ferroelectric capacitors (e.g., a pair FC0T, FC0B and a pair FC1T, FC1B) comprise the two ferroelectric capacitors of individual 4T-2FC memory cells MC*. The two ferroelectric capacitors individually comprise a first capacitor electrode (e.g., CBT0, CBB0, CBT1, CBB1) and a second capacitor electrode (e.g., CP) having a ferroelectric capacitor insulator 16 there-between. Ferroelectric capacitor insulator 16 comprises an annulus 18 radially outward of its first capacitor electrode CBT* or CBB*. Second capacitor electrode CP comprises a portion 20 (FIG. 5) radially outward of ferroelectric capacitor insulator annulus 18. Further, second capacitor electrode CP is the second capacitor electrode of, and is common to, all of the plurality of ferroelectric capacitors FC*T, FC*B in this example embodiment.

Columns 14 comprise pairs (e.g., a pair DLT0, DLB0 and a pair DLT1, DLB1) of first comparative digit lines (e.g., DLT0, DLT1) and second comparative digit lines (e.g., DLB0, DLB1) that are immediately-inter-column-adjacent one another. Such pairs may individually connect to a read/sense amplifier SA (FIG. 1, the construction of which may be at an edge of array 13), which may serve to amplify a difference signal that arises on the digit line pair when a memory cell MC* is read-accessed.

Rows 12 and columns 14 comprise shorting transistors (e.g., MCBRT0, MCBRB0, MCBRT1, MCBRB2) individually comprising a transistor gate 28 (FIG. 4) that comprises a portion of an individual shorting control line (e.g., CBR0, CBR1, CBR2) that interconnects multiple of the shorting transistors along individual rows 12. Pairs (e.g., a pair MCBRT0, MCBRB0 and a pair MCBRT1, MCBRB1) of two immediately-intra-row-adjacent shorting transistors comprise a first two transistors of individual 4T-2FC memory cells MC*. Such first two shorting transistors in individual 4T-2FC memory cells MC* individually are directly electrically coupled to and between different ones of respective first capacitor electrodes CBT*, CBB* and common second capacitor electrode CP.

Rows 12 and columns 14 comprise selecting transistors (e.g., MWL0T, MWL0B, MWL1T, MWL1B, and which alternately may be considered as access transistors) individually comprising a transistor gate 40 (FIG. 4) that comprises a portion of an individual word line (e.g., WL0, WL1, WL2) that interconnects multiple of the selecting transistors along individual rows 12. Pairs (e.g., a pair MWL0T, MWL0B and a pair MWL1T, MWL1B) of two immediately-intra-row-adjacent of the selecting transistors comprise a second two transistors of individual 4T-2FC memory cells MC*. Such second two selecting transistors in individual 4T-2FC memory cells MC* individually are directly electrically coupled to and between different ones of respective first capacitor electrodes CBT*, CBB* and different ones of first comparative digit lines DLT* or second comparative digit lines DLB* of individual pairs (e.g., DLT0/DLB0, DLT1/DLB1) of first and second comparative digit lines.

Figure 6:
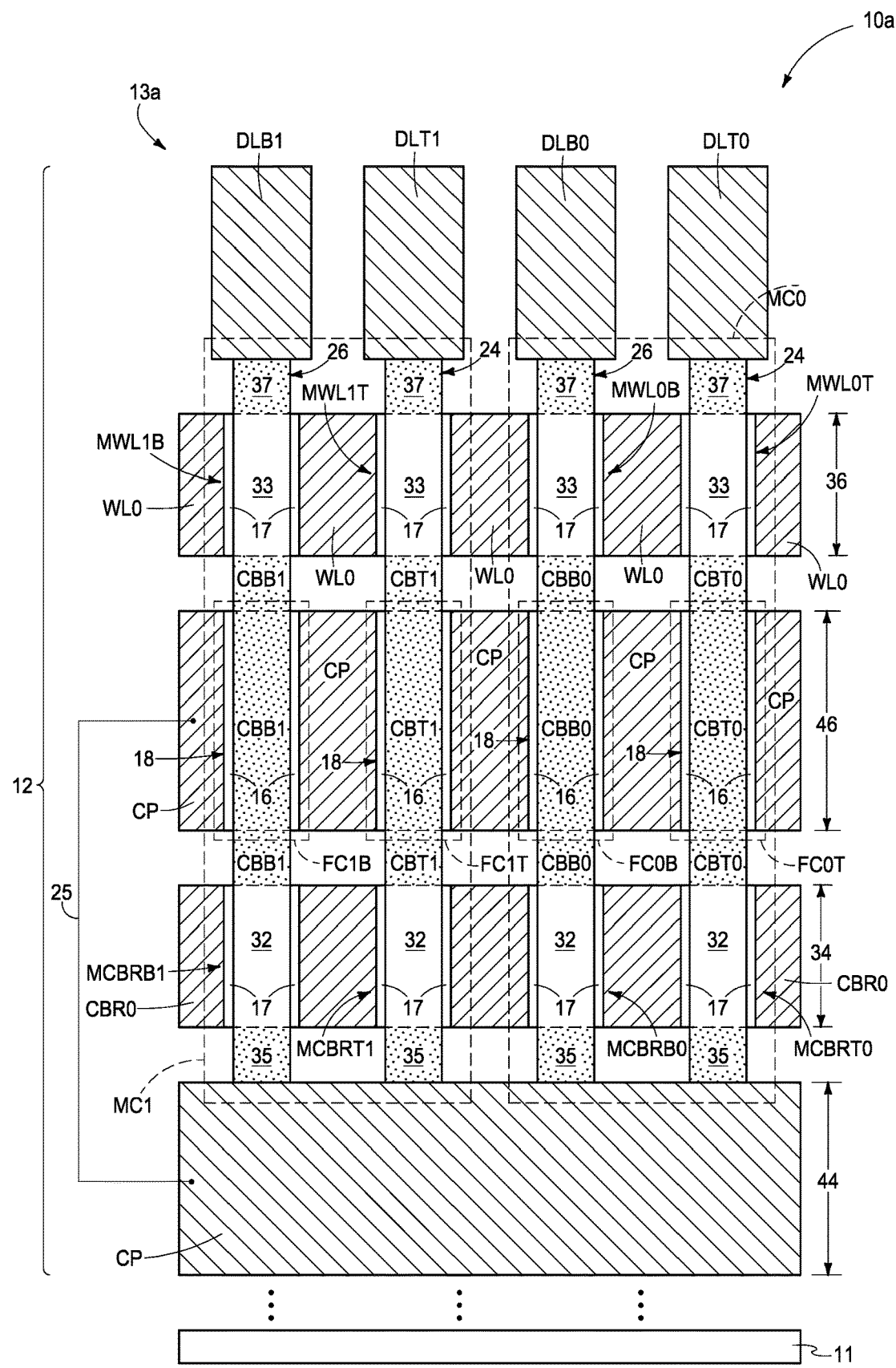
FIG. 6 is a diagrammatic hybrid schematic and structural cross-sectional view of a portion of another array of multiple 4T-2FC memory cells of the FIG. 1 schematic in accordance with an embodiment of the invention, and corresponds to the sectional view as shown in the FIG. 3 structure.

One of (a) the word lines, or (b) the shorting control lines is above all of the plurality of the ferroelectric capacitors, and the other of (a) or (b) is below all of the plurality of ferroelectric capacitors. FIGS. 2-5 depict an embodiment wherein (b): the shorting control lines are above all of the plurality of the ferroelectric capacitors. An alternate embodiment construction 10a of an array 13a is shown in FIG. 6 (analogous to FIG. 3) wherein (a): the word lines are above all of the plurality of the ferroelectric capacitors. Like numerals from the above-described embodiments have been used where appropriate, with some construction differences being indicated with the suffix "a". Any other attribute(s) or aspect(s) as shown and/or described herein with respect to other embodiments may be used in the FIG. 6 embodiment.

In one embodiment, all of the first and second comparative digit lines are either above or below all of the ferroelectric capacitors with the word lines. In other words, in such embodiment, all of the first and second comparative digit lines are either above or below all of the ferroelectric capacitors on whichever up-side or down-side the word lines are on, and as is shown by way of example only with respect to each of the FIGS. 2-5 embodiment and the FIG. 6 embodiment. In one such embodiment, the word lines are below all of the ferroelectric capacitors and all of the first and second comparative digit lines are below all of the word lines (e.g., the FIGS. 2-5 embodiment). In an alternate such embodiment, the word lines are above all of the ferroelectric capacitors and all of the first and second comparative digit lines are above all of the word lines (e.g., the FIG. 6 embodiment).

Figure 3:
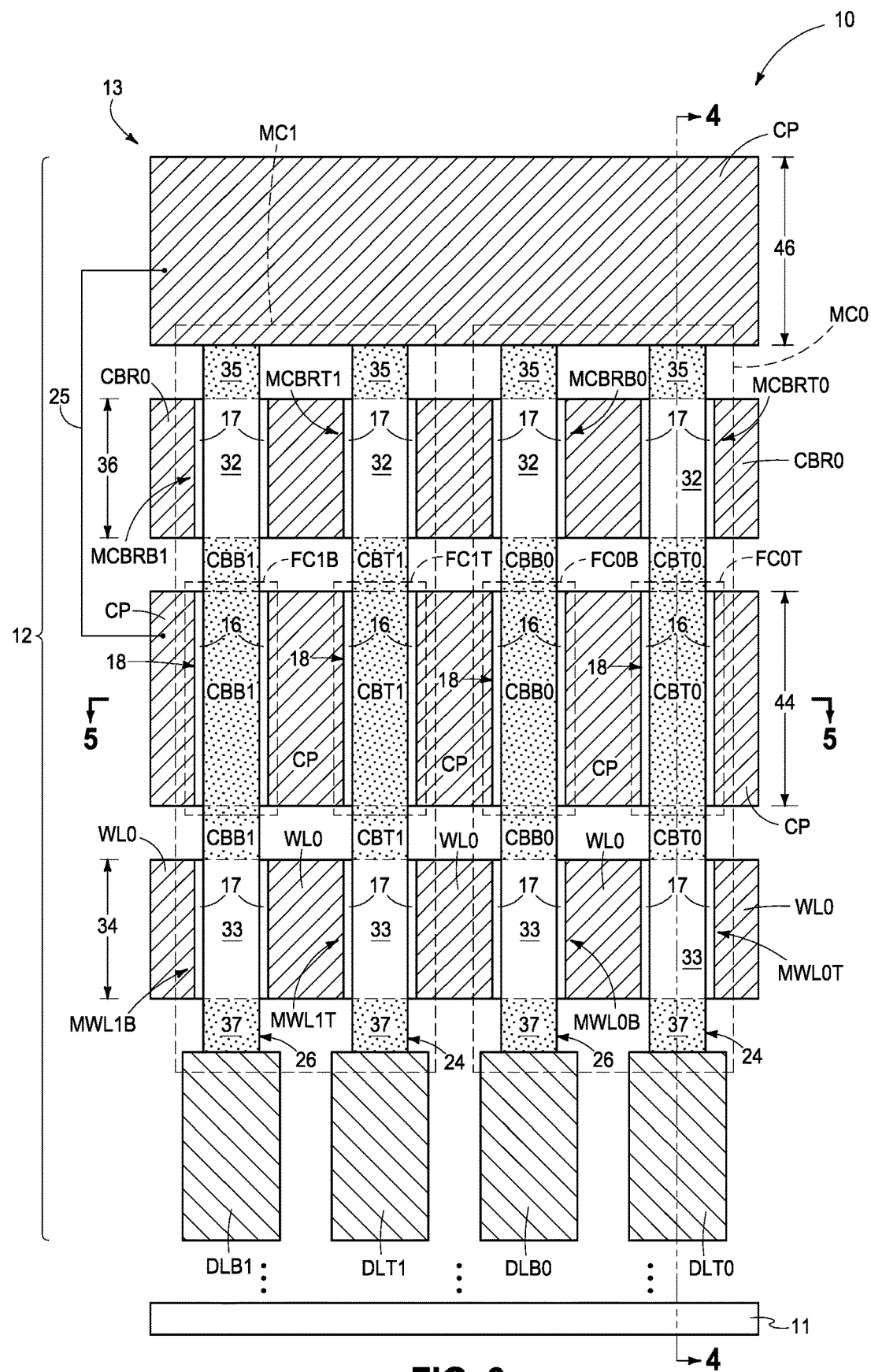
FIG. 3 is a cross-sectional view taken through line 3-3 in FIGS. 4 and 5.
Figure 4:
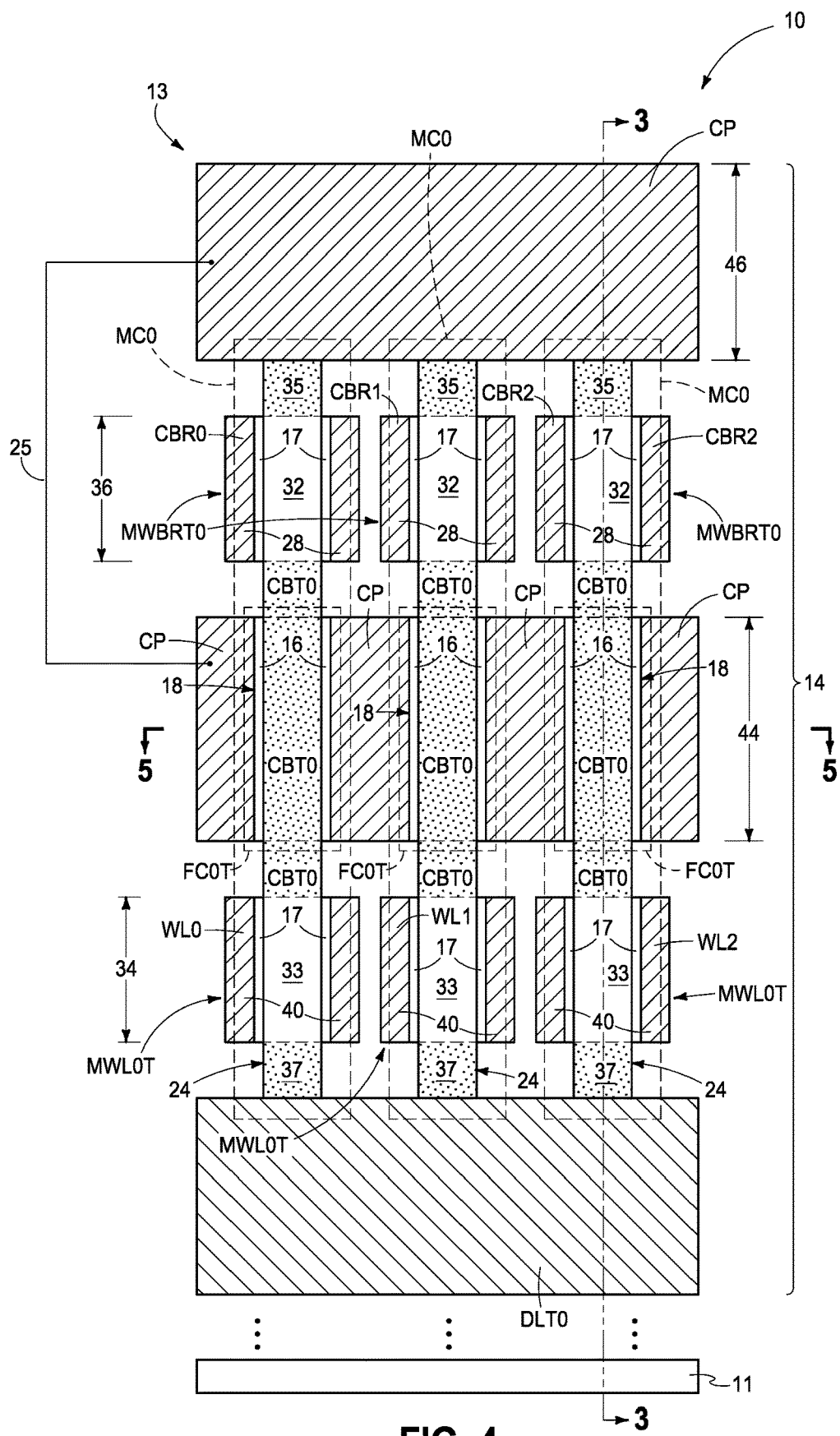
FIG. 4 is a cross-sectional view taken through line 4-4 in FIGS. 3 and 5.
Figure 5:
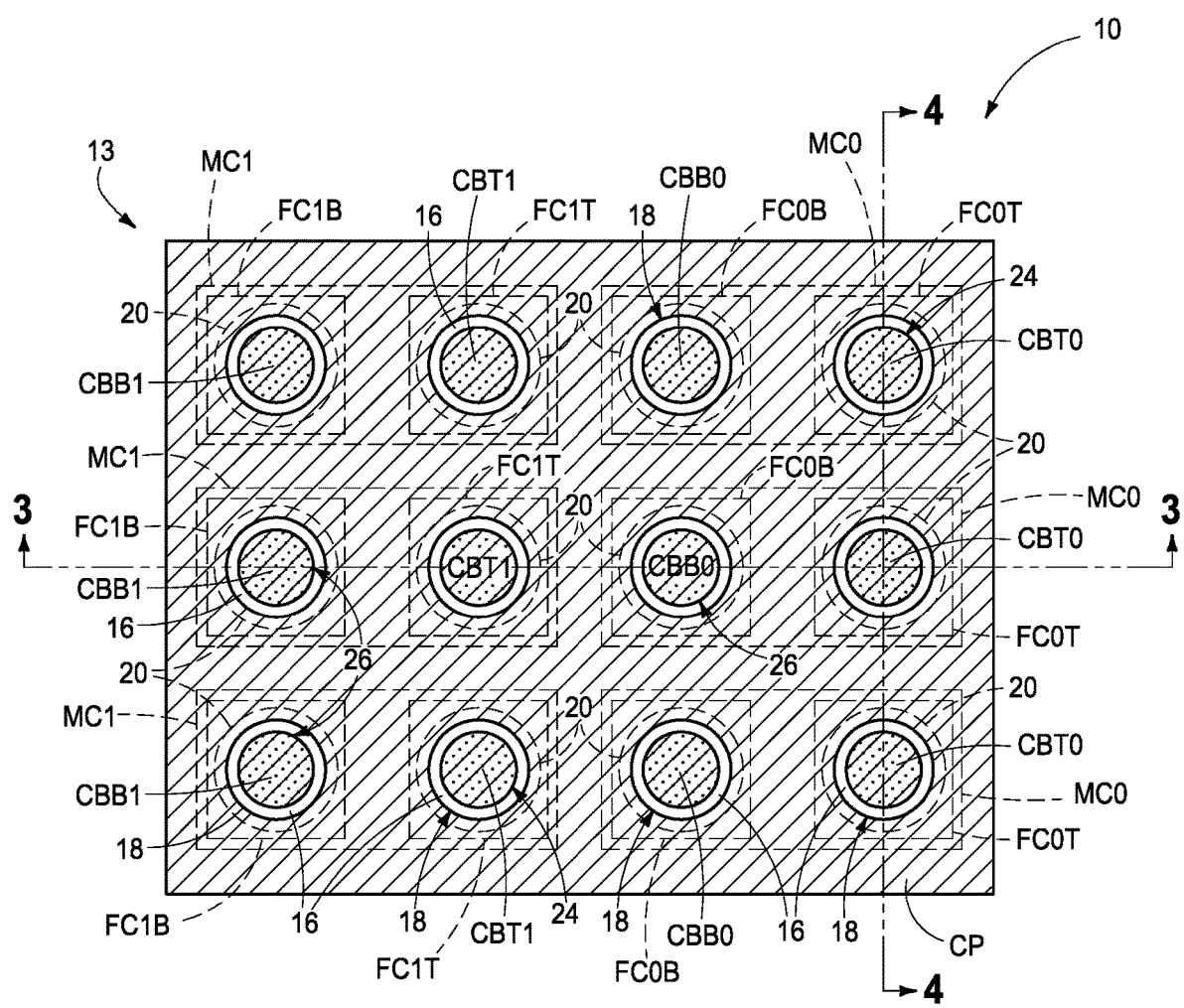
FIG. 5 is a cross-sectional view taken through line 5-5 in FIGS. 3 and 4.

In one embodiment and as shown, the shorting transistors and the selecting transistors are elevationally-extending transistors, and in one such embodiment are vertical or within 10° of vertical. In one embodiment, 4T-2FC memory cells MC* individually comprise a first elevationally-extending pillar (e.g., 24) and a second elevationally-extending pillar (e.g, 26) that are intra-row-spaced relative one another. In such embodiment, the shorting transistors and the selecting transistors of individual 4T-2FC memory cells MC* may be considered as individually comprising source/drain regions and an elevationally-extending channel region there-between. For example, FIGS. 3 and 4 show shorting transistors MCBRT*, MCBRB* individually comprising a source/drain region 35, a source/drain region CBT0, CBB0, CBT1, CBB1, and an elevationally-extending channel region 32 there-between. Source/drain regions 35 and second capacitor electrode CP may be considered as a single or collective electrode, and with the depicted two elevationally-spaced CP portions thereof being directly electrically coupled with one another in the FIGS. 2-6 embodiments (e.g. by a schematic interconnect line 25 the construction of which may be at an edge of array 13). Further, for example, selecting transistors MWL*T, MWL*B of individual 4T-2FC memory cells MC* individually comprise a source/drain region 37, a source/drain region CBT0, CBB0, CBT1, CBB1, and an elevationally-extending channel region 33 there-between. Channel regions 32 of shorting transistors MCBRT, MCBRB are intra-row-spaced from one another at one level 36 and channel regions 33 of selecting transistors MWL*T, MWL*B are intra-row-spaced from one another at another level 34 that is elevationally-spaced from level 36.

First pillars 24 individually comprise channel regions 32, 33 of one of shorting transistors MCBRT*, MCBRB* and one of selecting transistors MWL*T, MWL*B, respectively, of individual 4T-2FC memory cells MC*. First pillars 24 also individually comprise the source/drain regions of the respective ones of the shorting transistors and the respective ones of the selecting transistors of individual 4T-2FC memory cells MC*. First pillars 24 additionally individually comprise the first capacitor electrode CBBT*, CBBB* of one of the two ferroelectric capacitors of individual 4T-2FC memory cells MC*. Second pillars 26 individually comprise channel regions 32, 33 of the other of the shorting transistors and the other of the selecting transistors, respectively, of individual 4T-2FC memory cells MC*. Second pillars 26 also individually comprise the source/drain regions of the respective others of the shorting transistors and the respective others of the selecting transistors of individual 4T-2FC memory cells MC*. Second pillars 26 additionally individually comprise the first capacitor electrode of the other of the two ferroelectric capacitors of individual 4T-2FC memory cells MC*.

Any other attribute(s) or aspect(s) as shown and/or described herein with respect to other embodiments may be used in the FIGS. 1-5 embodiment.

An alternate example embodiment construction 10b of an array 13b of 4T-2FC memory cells MC* is next described with reference to FIGS. 8-12. Like numerals from the above-described embodiments have been used where appropriate, with some construction differences being indicated with the suffix "b" or with different numerals. Construction 10b differs in part from construction 10 in that the second capacitor electrode of the ferroelectric capacitors is not common to all of the plurality of the ferroelectric capacitors.

Rather, array 13b has second capacitor electrodes (e.g., CP1, CP2) of the two ferroelectric capacitors (e.g., FC*T, FC*B) of individual 4T-2FC memory cells MC* electrically isolated from one another (i.e., CP1 and CP2 are not directly electrically coupled to one another). First capacitor electrodes CBT*, CBB* of the two ferroelectric capacitors of individual 4T-2FC memory cells MC* are also electrically isolated from one another, and for example as is shown in the first-described embodiments. The depicted two elevationally-spaced CP1 portions are directly electrically coupled with one another as are the depicted two elevationally-spaced CP1 portions (e.g. by a schematic interconnect line 25 for the CP1 portions and by a schematic interconnect line 27 for the CP2 portions, and the constructions of which may be at an edge of array 13b).

Additionally, in construction 10b, columns 14 comprise pairs (e.g., a pair DLT0, DLT1) of immediately-inter-column-adjacent first comparative digit lines (DLT0, DLT1) and pairs (e.g., a pair DLB0, DLB1) of immediately-inter-column-adjacent second comparative digit lines (DLB0, DLB1). Individual memory cells MC* comprise one of first comparative digit lines DLT0 or DLT1 and one of second comparative digit lines DLB0 or DLB1. Accordingly, all of the components of an individual memory cell MC* are not all immediately-intra-row-adjacent one another as, for example, is shown in constructions 10/10a of the first-described embodiments.

Rows 12 and columns 14 again comprise shorting transistors MCBRT*, MCBRB* individually comprising a transistor gate 28 that comprises a portion of an individual shorting control line CBR* that interconnects multiple of the shorting transistors along individual rows 12. However, pairs (e.g., a pair MCBRT0, MCBRB0 and a pair MCBRT1, MCBRB1) of every-other-ones of the shorting transistors in individual rows 12 comprise a first two transistors of individual 4T-2FC memory cells MC*. The first two shorting transistors in individual 4T-2FC memory cells MC* individually are directly electrically coupled to and between different ones of the respective first capacitor electrodes CBT*, CBB* and different ones of the respective second capacitor electrodes CP*, CP*.

Figure 13:
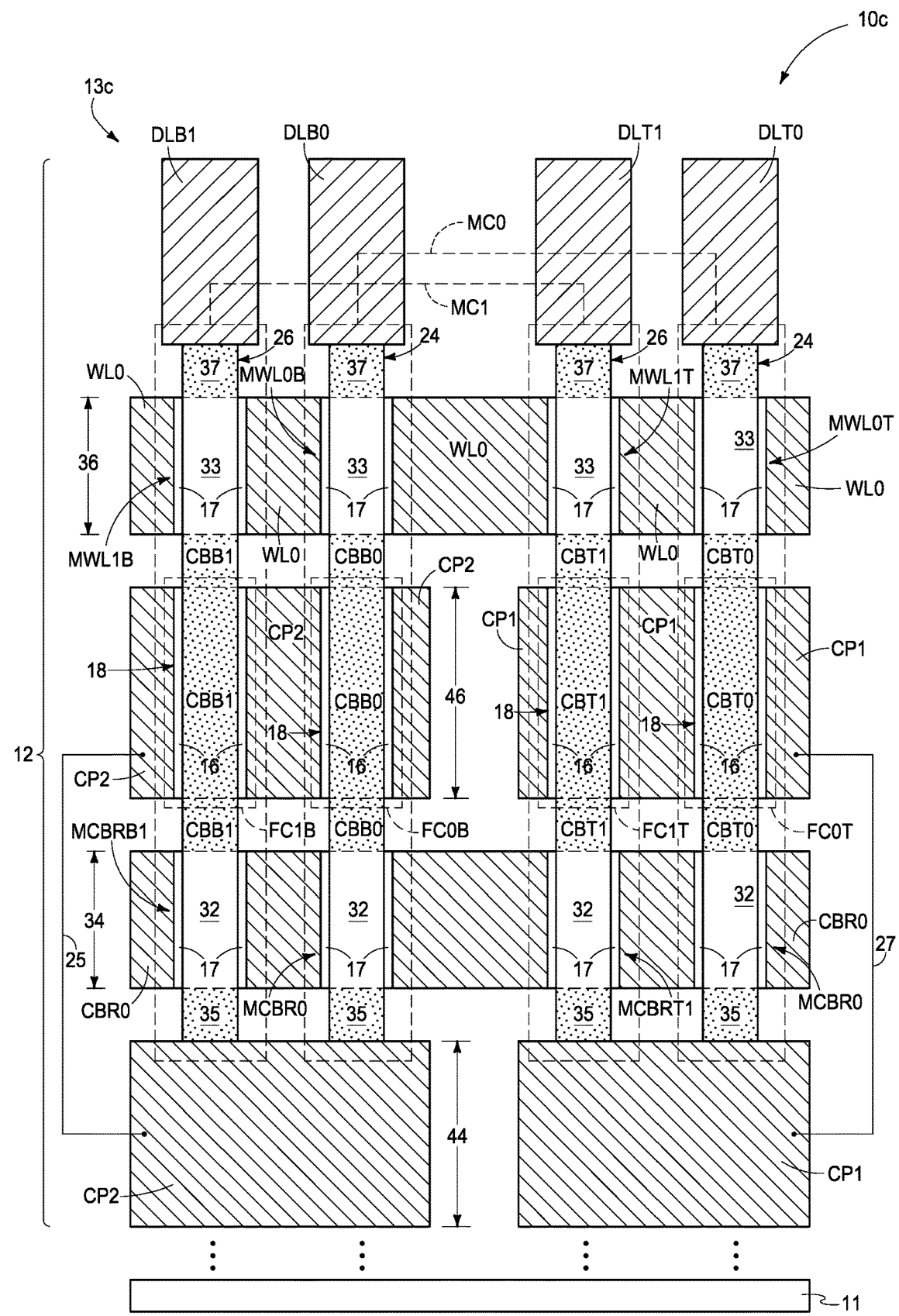
FIG. 13 is a diagrammatic hybrid schematic and structural cross-sectional view of a portion of another array of multiple 4T-2FC memory cells of the FIG. 8 schematic in accordance with an embodiment of the invention, and corresponds to the sectional view as shown in the FIG. 10 structure.

Rows 12 and columns 14 again comprise selecting transistors MWL*T, MWL*B individually comprising a transistor gate 40 that comprises a portion of an individual word line WL* that interconnects multiple of the selecting transistors along individual rows 12. However, pairs (e.g., a pair MWL0T, MWL0B and a pair MWL1T, MWL1B) of every-other-ones of the selecting transistors in individual rows 12 comprise a second two selecting transistors of individual 4T-2FC memory cells MC*. The second two selecting transistors in individual 4T-2FC memory cells MC* individually are directly electrically coupled to and between different ones of the respective first capacitor electrodes CBT*, CBB* and different ones of the respective first or second comparative digit lines DLT*, DLB*. One of (a) the word lines or (b) the shorting control lines is above all of the ferroelectric capacitors, and the other of (a) or (b) is below all of the ferroelectric capacitors. FIGS. 9-12 show an example embodiment wherein (b): the shorting control lines are above all of the ferroelectric capacitors. FIG. 13 shows an alternate example embodiment wherein (a): the word lines are above all of the ferroelectric capacitors. Like numerals from the above-described embodiments have been used where appropriate, with some construction differences being indicated with the suffix "c". Any other attribute(s) or aspect(s) as shown and/or described herein may be used with respect to the embodiment of FIGS. 8-12 and the embodiment of FIG. 13.

Figure 8:
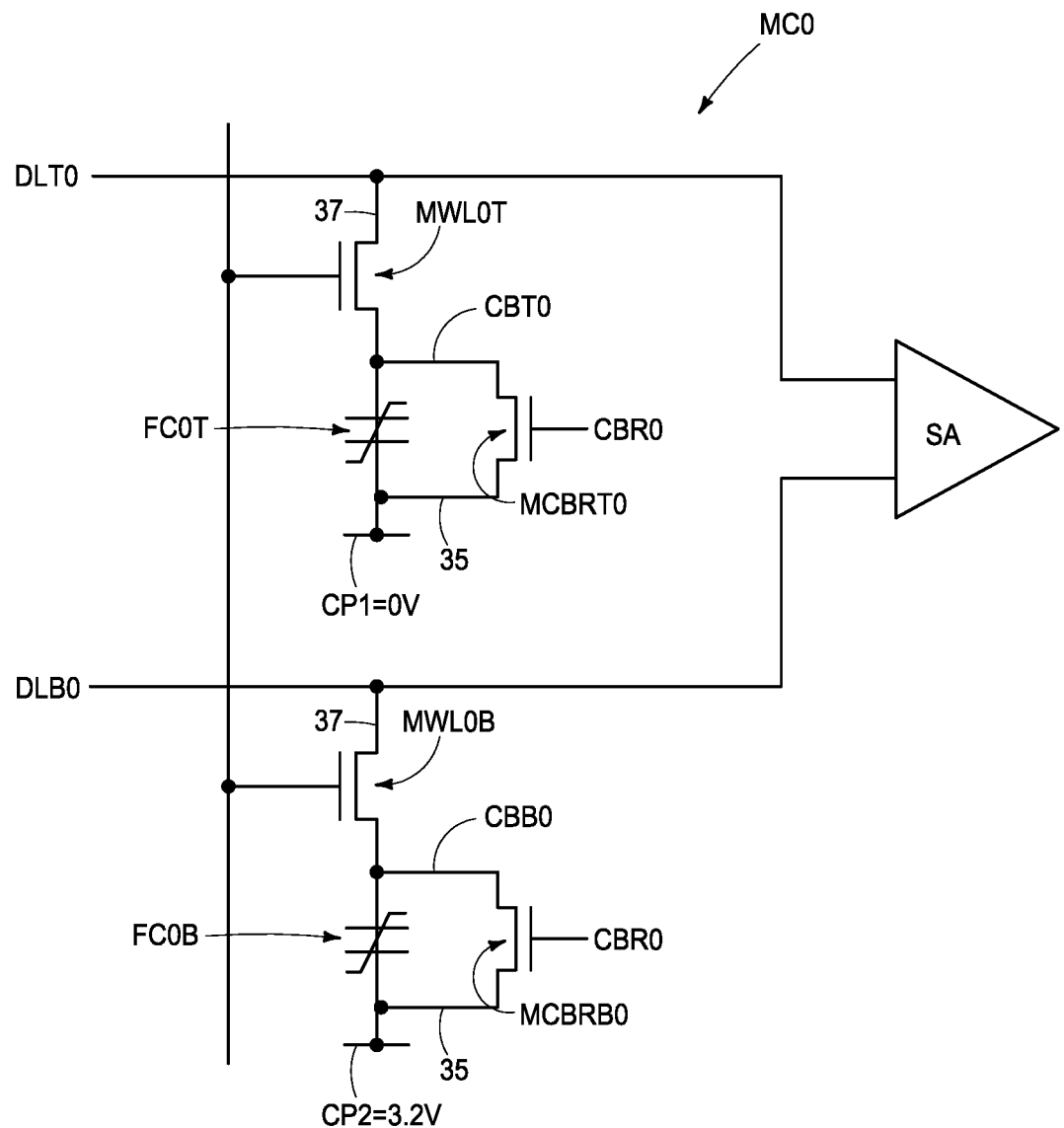
FIG. 8 is a non-structural diagrammatic schematic of a single 4T-2FC memory cell in accordance with an embodiment of the invention.
Figure 9:
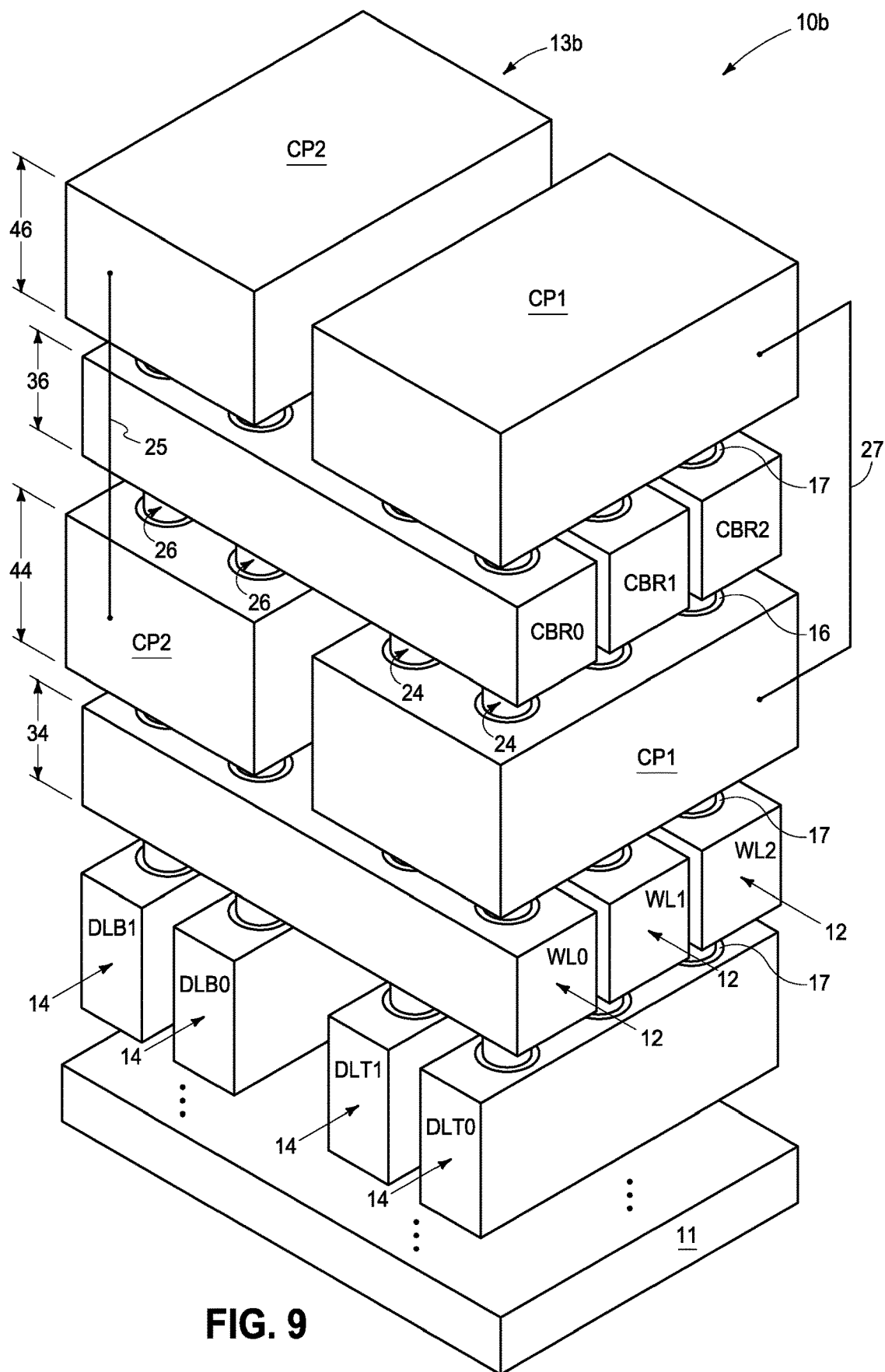
FIG. 9 is a diagrammatic hybrid schematic and structural perspective view of a portion of an array of multiple 4T-2FC memory cells of the FIG. 8 schematic in accordance with an embodiment of the invention.
Figure 10:
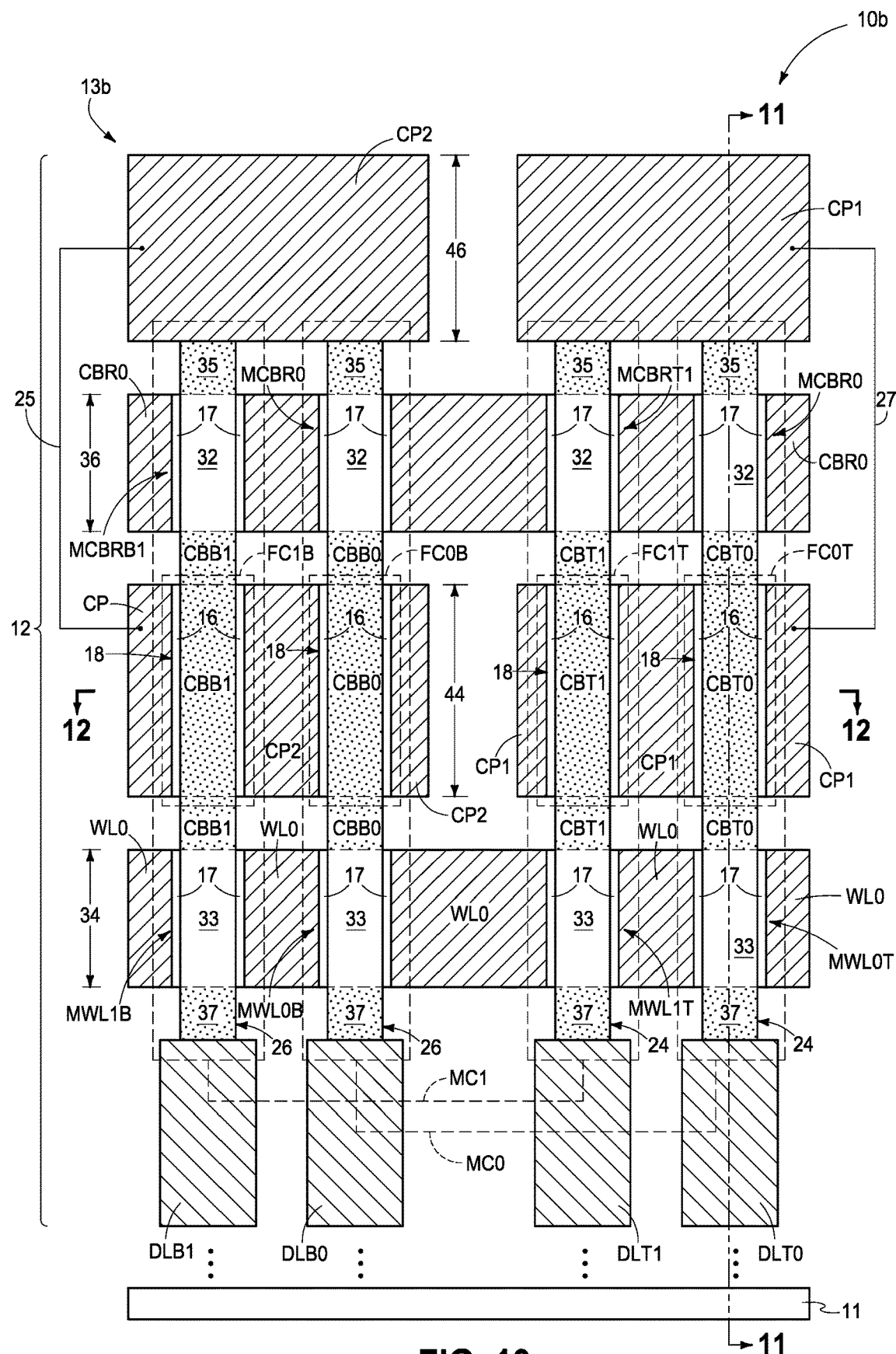
FIG. 10 is a cross-sectional view taken through line 10-10 in FIGS. 11 and 12.
Figure 11:
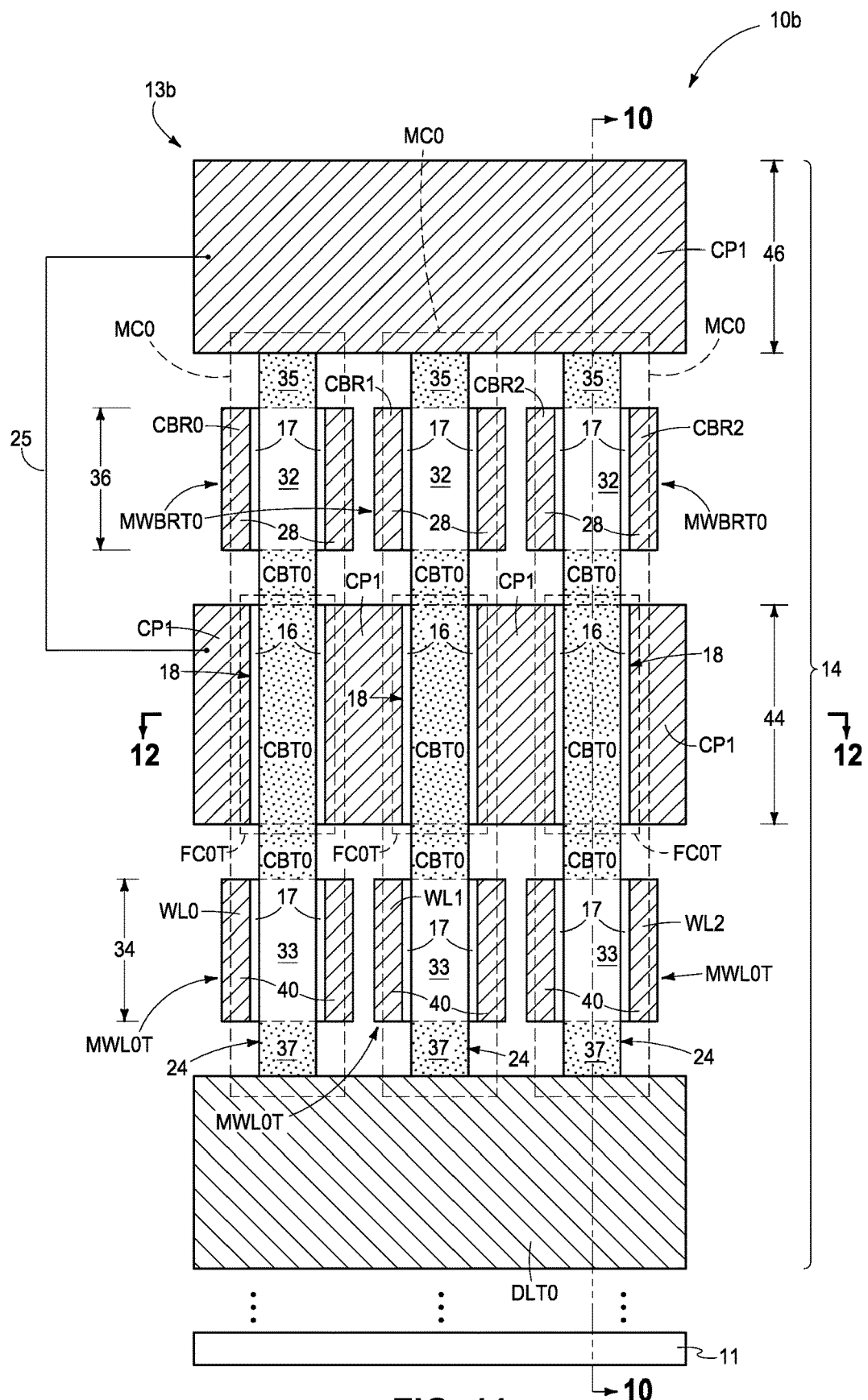
FIG. 11 is a cross-sectional view taken through line 11-11 in FIGS. 10 and 12.
Figure 12:
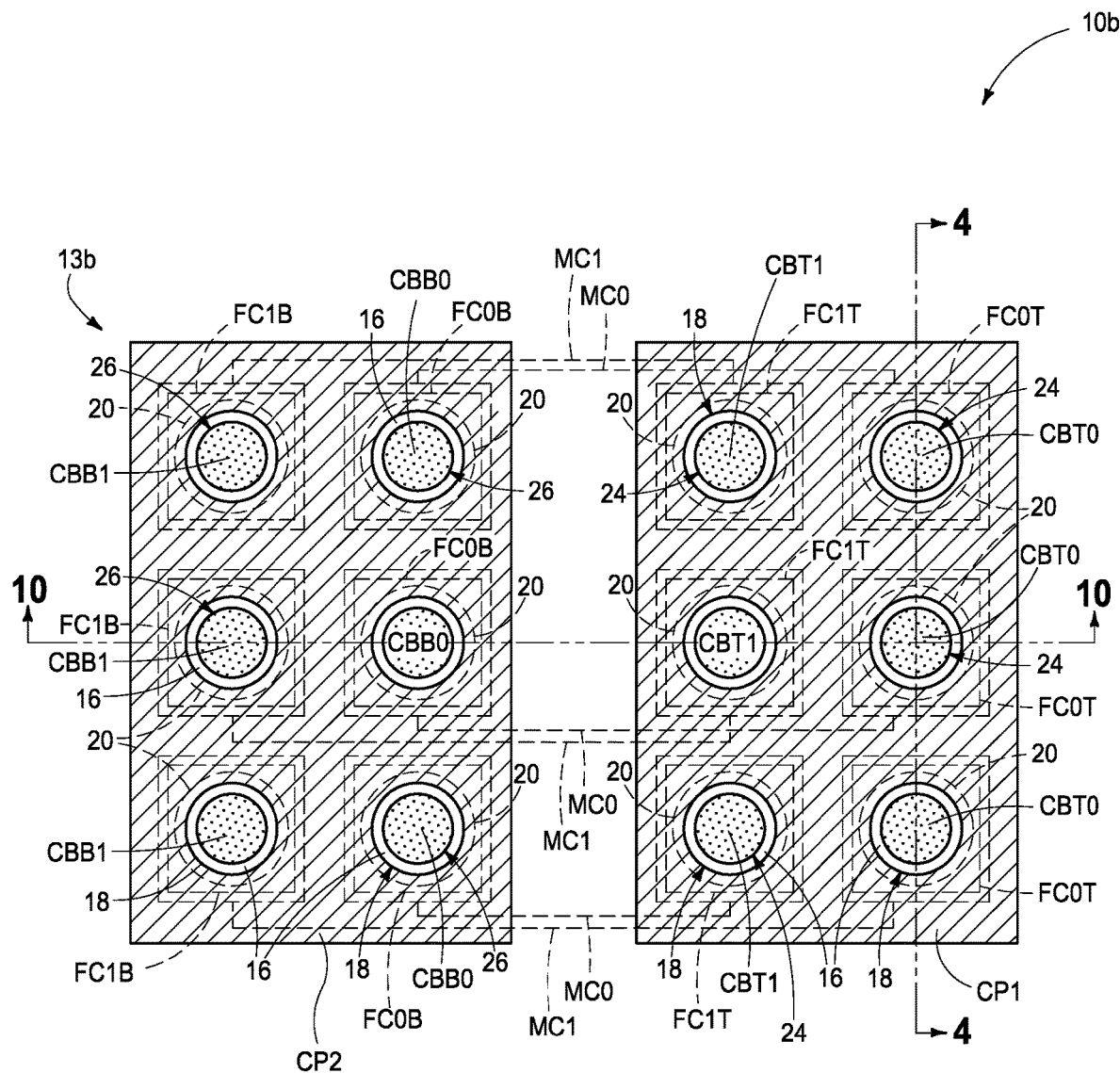
FIG. 12 is a cross-sectional view taken through line 12-12 in FIGS. 10 and 11.

Some embodiments of the invention comprise a 4T-2FC memory cell regardless of whether being of the FIG. 1 schematic, the FIG. 8 schematic, or some other schematic, and may include an array of such 4T-2FC memory cells. In one such embodiment, a 4T-2FC memory cell comprises first, second, third, and fourth transistors (e.g., MCBRT0, MCBRB0, MWL0T, MWL0B, respectively). The 4T-2FC memory cell comprises first and second ferroelectric capacitors (e.g., FC0T, FC0B, respectively) individually having one capacitor electrode (e.g., CP in the FIG. 1 schematic, CP* in the FIG. 8 schematic) at two elevationally-spaced levels (e.g., a level 44, a level 46). A ferroelectric capacitor insulator (e.g., 16) is between the one capacitor electrode and another capacitor electrode (e.g., CBT*, CBB*) in one of the two levels (e.g., 44 in construction 10) and no ferroelectric capacitor insulator is between the one and the another capacitor electrodes in the other of the two levels (e.g., 46 in construction 10 at least because neither of CBT* and CBB* is anywhere within level 46).

In one embodiment, the first, second, third, and fourth transistors individually comprise a transistor gate (e.g., 28, 40), with one of the gates (e.g., 28 in construction 10) being elevationally between the two elevationally-spaced levels. In one such embodiment, another one of the gates (e.g., 40 in construction 10) is not elevationally between the two elevationally-spaced levels. In one embodiment, multiple of the transistor gates (e.g., 28 in construction 10) are elevationally between the two elevationally-spaced levels. In one such embodiment, two and only two of the transistor gates are elevationally between the two elevationally-spaced levels. In one embodiment, two of the first, second, third, and fourth transistors are shorting transistors (e.g., MCBR0T, MCBR0B) that are directly electrically coupled to and between different ones of the respective one capacitor electrode and different ones of the another capacitor electrodes.

In one embodiment, an array (e.g., 13, 13a) comprises the 4T-2FC memory cell as one memory cell of a plurality of 4T-2FC memory cells of like-construction relative one another, and wherein the one capacitor electrode is the one capacitor electrode of, and that is common to, all of the ferroelectric capacitors of the plurality of the 4T-2FC memory cells. In another embodiment, an array (e.g., 13b, 13c) comprises the 4T-2FC memory cell as one memory cell of a plurality of 4T-2FC memory cells of like-construction relative one another. In such embodiment, the one capacitor electrodes of the first and second ferroelectric capacitors in individual of the 4T-2FC memory cells are electrically isolated from one another. In such embodiment, the another capacitor electrodes of the first and second ferroelectric capacitors in the individual 4T-2FC memory cells are electrically isolated from one another.

Any other attribute(s) or aspect(s) as shown and/or described herein may be used.

Additional embodiments of the invention comprise a 4T-2FC memory cell regardless of whether being of the FIG. 1 schematic, the FIG. 8 schematic, or some other schematic, and may include an array of such 4T-2FC memory cells. In one such embodiment, a 4T-2FC memory cell comprises first, second, third, and fourth transistors (e.g., MCBRT0, MCBRB0, MWL0T, MWL0B, respectively). The 4T-2FC memory cell comprises first and second ferroelectric capacitors (e.g., FC0T, FC0B, respectively) individually have one capacitor electrode (e.g., CBT0, CBB0) elevationally between the transistor gates of the first, second, third, and fourth transistors. In one embodiment, the first and second ferroelectric capacitors individually have another capacitor electrode (e.g., CP, CP1, CP2) some portion of which (e.g., that within level 44 in construction 10) is elevationally between the transistor gates of the first, second, third, and fourth transistors. In one embodiment, the first and second ferroelectric capacitors individually have another capacitor electrode (e.g., CP, CP1, CP2) only a portion of which (e.g., that within level 44 in construction 10) is elevationally between the transistor gates of the first, second, third, and fourth transistors. In one embodiment, an array (e.g., 13, 13a, 13b, 13c) comprises the 4T-2FC memory cell as one memory cell of a plurality of 4T-2FC memory cells of like-construction relative one another. Any other attribute(s) or aspect(s) as shown and/or described herein may be used.

Additional embodiments of the invention comprise a 4T-2FC memory cell regardless of whether being of the FIG. 1 schematic, the FIG. 8 schematic, or some other schematic, and may include an array of such 4T-2FC memory cells. In one such embodiment, a 4T-2FC memory cell comprises first, second, third, and fourth transistors (e.g., MCBRT0, MCBRB0, MWL0T, MWL0B, respectively). The 4T-2FC memory cell comprises first and second ferroelectric capacitors (e.g., FC0T, FC0B, respectively) individually comprising first and second capacitor electrodes (e.g., CBT0, CBB0, and CP, CP1, CP2, respectively) having a ferroelectric capacitor insulator (e.g., 16) there-between. The first capacitor electrode comprises an elevationally-extending pillar (e.g., 24, 26). The ferroelectric capacitor insulator comprises an annulus (e.g., 18) radially outward of the first capacitor electrode. The second capacitor electrode comprises a portion (e.g., 20) radially outward of the ferroelectric-capacitor-insulator annulus. In one embodiment, conductive material of the pillar (e.g., material of CBT*, CBB*) extends entirely diametrically across all of the pillar.

In one embodiment, the first, second, third, and fourth transistors individually comprise a transistor gate (e.g., 28, 40). The gates (e.g., 28 in construction 10) of two of the first, second, third, and fourth transistors (e.g., MCBRT0, MCBRB0 in construction 10) are above the portion of the second capacitor electrode that is radially outward of the ferroelectric-capacitor-insulator annulus. The gates (e.g., 40 in construction 10) of another two of the first, second, third, and fourth transistors (e.g., MWL0T, MWL0B in construction 10) are below the portion of the second capacitor electrode that is radially outward of the ferroelectric-capacitor-insulator annulus.

Any other attribute(s) or aspect(s) as shown and/or described herein may be used.

Additional embodiments of the invention comprise a 4T-2FC memory cell regardless of whether being of the FIG. 1 schematic, the FIG. 8 schematic, or some other schematic, and may include an array of such 4T-2FC memory cells. In one such embodiment, a 4T-2FC memory cell comprises first and second laterally-spaced and elevationally-extending pillars (e.g., 24, 26, respectively). The 4T-2FC memory cell comprises first and second ferroelectric capacitors (e.g., FC0T, FC0B, respectively) individually comprising first and second capacitor electrodes (e.g., CBT0, CBB0, and CP, CP1, CP2, respectively) having a ferroelectric capacitor insulator (e.g., 16) there-between. The 4T-2FC memory cell comprises first, second, third, and fourth elevationally-extending transistors (e.g., MCBRT0, MCBRB0, MWL0T, MWL0B, respectively) individually comprising source/drain regions (e.g., 35, CBT0, CBB0, 37), an elevationally-extending channel region (e.g., 32, 33) between the source/ drain regions and a transistor gate (e.g., 28, 40) operatively proximate the channel region (e.g., a gate insulator 17 being between the channel and the gate). The channel regions (e.g., 32 in construction 10) of the first and second transistors (e.g., MCBRT0, MCBRB0 in construction 10) are laterally adjacent one another above the second capacitor electrodes. The channel regions (e.g., 33 in construction 10) of the third and fourth transistors (e.g., MWL0T, MWL0B in construction 10) are laterally adjacent one another below the second capacitor electrodes. The first pillar comprises the source/drain regions and the channel regions of the first and third transistors. The first pillar comprises the first capacitor electrode of the first ferroelectric capacitor. The second pillar comprises the source/drain regions and the channel regions of the second and fourth transistors. The second pillar comprises the first capacitor electrode of the second ferroelectric capacitor. Any other attribute(s) or aspect(s) as shown and/or described herein may be used.

In some embodiments, any one or more of the elevationally-extending features is formed to be vertical or within 10° of vertical.

Figure 7:
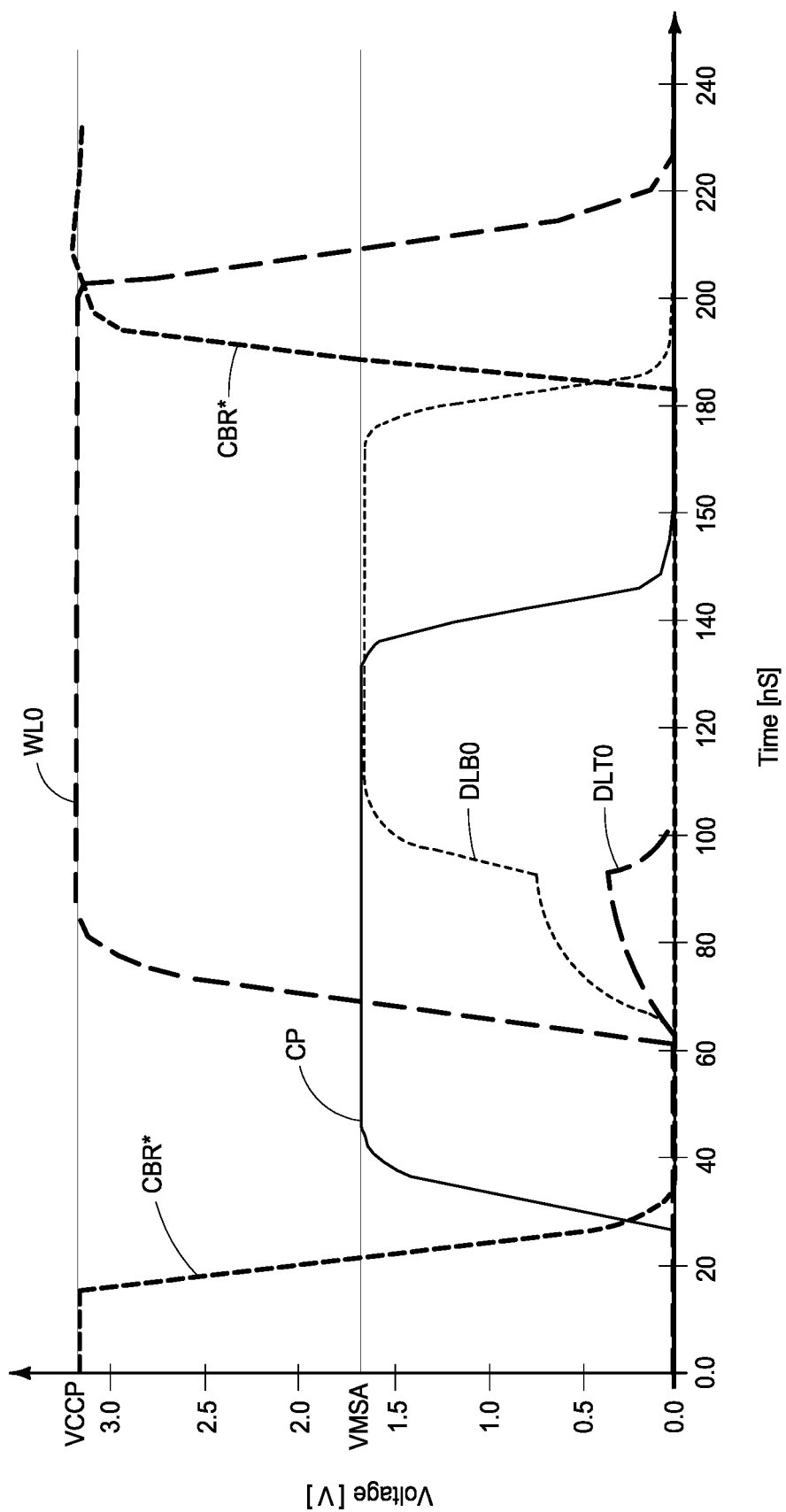
FIG. 7 is a graph of voltage vs. time showing some possible operating characteristics of a 4T-2FC memory cell in accordance with the embodiments of FIGS. 1-6.
Figure 15:
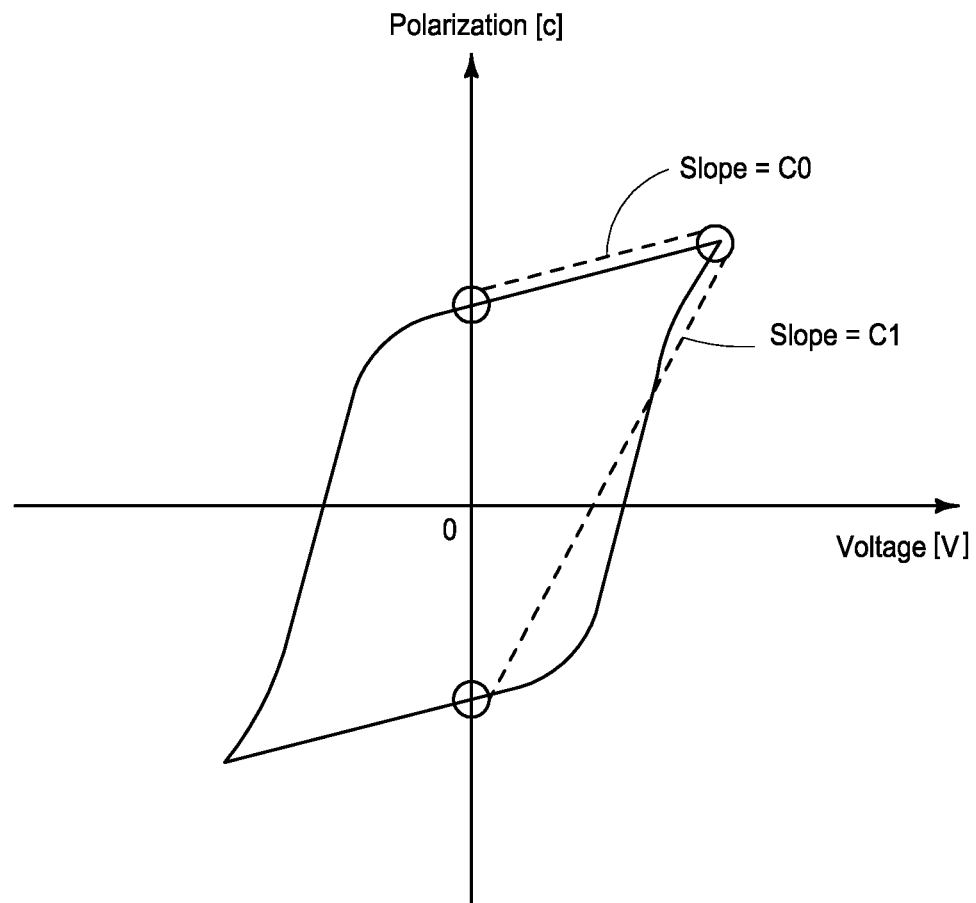
FIG. 15 is a graph of a hysteresis loop of a ferroelectric capacitor.

FIG. 7 is a graph of voltage vs. time showing some possible operating characteristics of a 4T-2FC memory cell in accordance with the embodiments of FIGS. 1-6. More specifically, FIG. 7 is the timing diagram of a read and write cycle for a FIGS. 1-6 memory cell MC0. Since no voltage difference may be allowed across ferroelectric capacitors FC0T and FC0B, the equilibrium signal CBR0 is at VCCP during stand-by. At the beginning of a cycle, the equilibrium CBR0 is turned off to disconnect cell plate CP from the other node of ferroelectric capacitor FC0T, CBT0 which is at the same potential as cell plate CP. Digit lines DLT0 and DLB0 are pre-charged to ground during stand-by. As soon as CBR0 is turned off, the digit lines are disconnected from ground and become voltage-floating and cell plate CP is raised to VMSA while CBT0 and CBB0 are both pulled up to a level similar to that of cell plate CP due to capacitance of the ferroelectric capacitor which is sufficiently larger than the parasitic capacitance value of CBT0 or CBB0. Then, to access ferroelectric capacitors FC0T and FC0B, word line WL0 is raised up to VCCP level. As soon as WL0 reaches the threshold voltage of selecting transistors MWL0T and MWL0B, a charge transfer occurs between digit lines DLT0, DLB0 and ferroelectric capacitor FC0T, FC0B, respectively. The digit line voltages are established according to their relative capacitances. The ferroelectric capacitor's two capacitances, a 0 or a 1, can be approximated by one of two linear capacitors C0 or C1 as shown in FIG. 15. Thus the voltage developed on digit lines DLT0 and DLB0 can be one of two values, V0 or V1:

$$V_{digit\ line} = V0 = \{C0/(C0+C_{digit\ line})\} \times VMSA\ \text{(if cell data is a 0)}$$

$$V_{digit\ line} = V1 = \{C1/(C1+C_{digit\ line})\} \times VMSA\ \text{(if cell data is a 1)}$$

The data on capacitors FC0T and FC0B is complimentary to each other. Therefore, if FC0T is a 1, then FC0B is a 0, and vice versa. As soon as the developed voltage difference between DLT0 and DLB0 is stable, read/sense amplifier SA drives them to full scale voltages VMSA and ground level and the read data will finally be written back to the capacitors as follows: when cell plate CP is high, DLT0 is clamped to ground level and cell plate CP is VMSA, then data of a 0 is written to capacitor FC0T. On the other hand, when cell plate CP is at ground and digit line DLB0 is at VMSA, compliment data of a 1 is written to capacitor FC0B. After data is written back to the capacitors, digit lines and cell plates CP are driven to ground and the equilibrium signal CBR0 turns on to ensure no voltage difference across the top and bottom nodes of ferroelectric capacitors FC0T and FC0B which may be needed to avoid the capacitor from losing signal in the capacitors due to imprint or disturb or retention issues. At the end of the cycle, word line WL0 is turned off to ground level.

Figure 14:
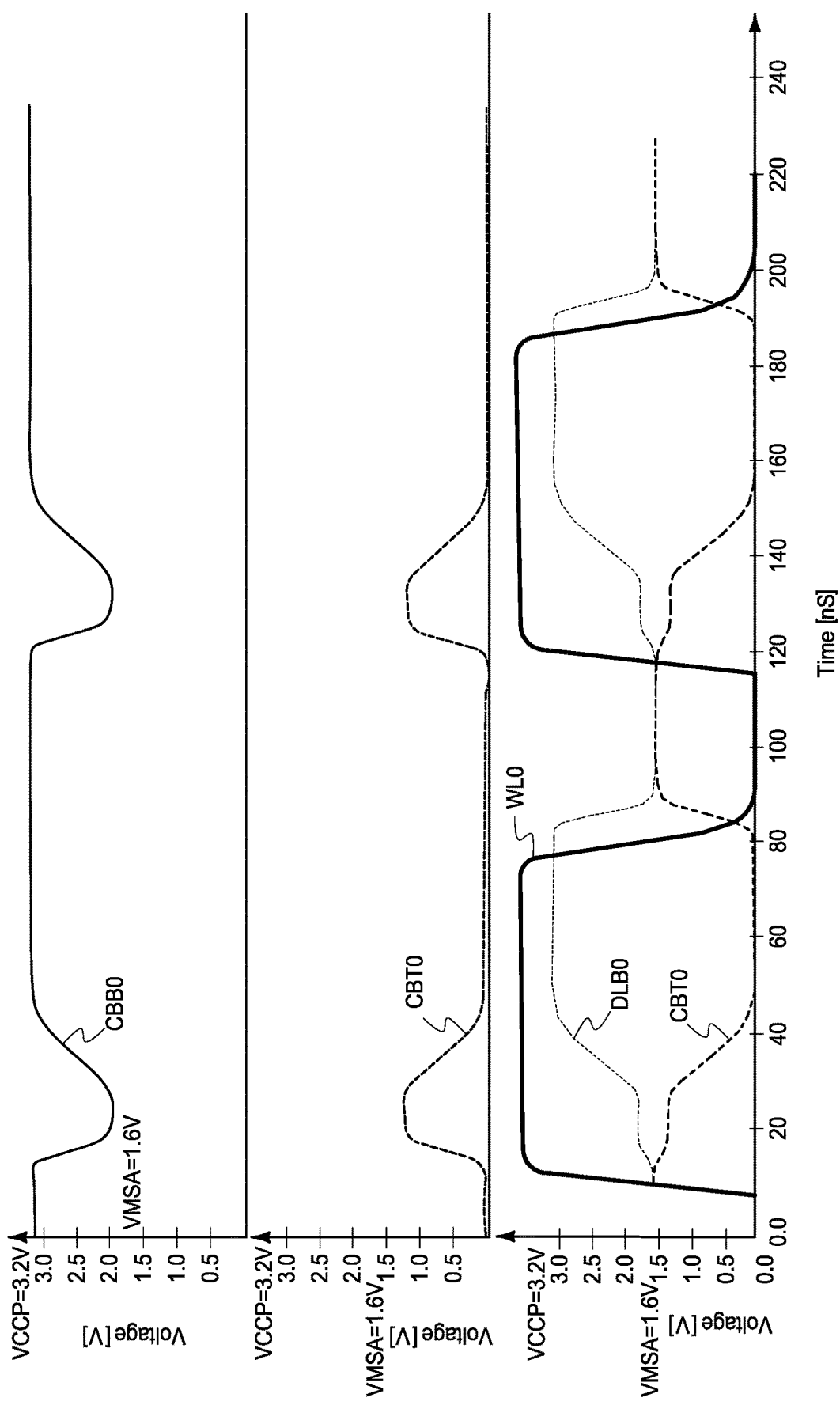
FIG. 14 is a graph of voltage vs. time showing some possible operating characteristics of a 4T-2FC memory cell in accordance with the embodiments of FIGS. 8-13.

FIG. 14 is a graph of voltage vs. time showing some possible operating characteristics of a 4T-2FC memory cell MC0 in accordance with the embodiments of FIGS. 8-13. The top graph of FIG. 14 represents the potential curve of the electrode of capacitor FC0B which is connected to transistor MWL0B. The middle graph of FIG. 14 represents the potential curve of the electrode of capacitor FC0T which is connected to transistor MWL0T. The bottom graph of FIG. 14 represents the potential curve of word line WL0 and of the two successive read-accesses are shown, whereby a logic "0" is stored in capacitors FC0T, FC0B. Before the memory cells are read-accessed, the two digit lines DLT0, DLB0 are pre-charged to a common bias potential VMSA=1.6V. This corresponds to the average value of the two plate potentials CP1=0V and about CP=3.2V. Word line WL0 then becomes active with a positive edge. Transistors MWL0T, MWL0B are thereby switched "on"/to conduct, so that a charge equalization occurs between digit lines DLT0, DLB0 and capacitors FC0T, FC0B. In the case of a stored logic "0", the potential of digit line DLT0 is slightly reduced, and the potential of digit line DLB0 is slightly increased. Next, read/sense amplifier SA is activated, whereby the difference signal on digit line pair DLT0, DLB0 is amplified. The read-access ends with a negative edge of potential on word line WL0.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 450 from exactly horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above", "directly under", and "directly below" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" or "below" not preceded by "directly" only requires that some portion of the stated region/material/component that is under/below the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Use of "row" and "column" in this document is for convenience in distinguishing one series or orientation of features from another series or orientation of features and along which components have been or will be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell comprising:
    first, second, third, and fourth transistors; and
    first and second ferroelectric capacitors individually having one capacitor electrode at two elevationally-spaced levels, a ferroelectric capacitor insulator being between the one capacitor electrode and another capacitor electrode in one of the two elevationally-spaced levels and no ferroelectric capacitor insulator being between the one and the another capacitor electrodes in the other of the two elevationally-spaced levels.

2. The memory cell of claim 1 wherein the first, second, third, and fourth transistors individually comprise a transistor gate, one of the gates being elevationally between the two elevationally-spaced levels.

3. The memory cell of claim 2 wherein another one of the gates is not elevationally between the two elevationally-spaced levels.

4. The memory cell of claim 2 wherein multiple of the transistor gates are elevationally between the two elevationally-spaced levels.

5. The memory cell of claim 4 wherein two and only two of the transistor gates are elevationally between the two elevationally-spaced levels.

6. The memory cell of claim 1 wherein two of the first, second, third, and fourth transistors are shorting transistors that are directly electrically coupled to and between different ones of the respective one capacitor electrode and different ones of the respective another capacitor electrodes.

7. An array comprising the memory cell of claim 1 as one memory cell of a plurality of memory cells of like-construction relative one another, wherein the one capacitor electrode is the one capacitor electrode of, and that is common to, all of the ferroelectric capacitors of the plurality of the memory cells.

8. An array comprising the memory cell of claim 1 as one memory cell of a plurality of memory cells of like-construction relative one another, wherein,
    the one capacitor electrodes of the first and second ferroelectric capacitors in individual of the memory cells are electrically isolated from one another; and
    the another capacitor electrodes of the first and second ferroelectric capacitors in the individual memory cells are electrically isolated from one another.

9. The memory cell of claim 1 wherein the first, second, third, and fourth transistors individually are elevationally-extending to be vertical or within 10° of vertical.

10. The memory cell of claim 1 wherein the memory cell is 4T-2FC.

* * * * *